United States Patent
Seki et al.

(10) Patent No.: US 9,756,732 B2
(45) Date of Patent: Sep. 5, 2017

(54) DEVICE EMBEDDED SUBSTRATE AND MANUFACTURING METHOD OF DEVICE EMBEDDED SUBSTRATE

(71) Applicant: MEIKO ELECTRONICS CO., LTD., Ayase-shi, Kanagawa (JP)

(72) Inventors: Yasuaki Seki, Ayase (JP); Tomoyuki Nagata, Ayase (JP); Mitsuaki Toda, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 66 days.

(21) Appl. No.: 14/760,982

(22) PCT Filed: Jan. 18, 2013

(86) PCT No.: PCT/JP2013/050984
§ 371 (c)(1),
(2) Date: Jul. 14, 2015

(87) PCT Pub. No.: WO2014/112108
PCT Pub. Date: Jul. 24, 2014

(65) Prior Publication Data
US 2015/0327369 A1    Nov. 12, 2015

(51) Int. Cl.
*H05K 1/18* (2006.01)
*H05K 1/11* (2006.01)
(Continued)

(52) U.S. Cl.
CPC .............. *H05K 1/186* (2013.01); *H01L 24/19* (2013.01); *H01L 24/24* (2013.01); *H01L 24/82* (2013.01);
(Continued)

(58) Field of Classification Search
CPC .......... H05K 2201/09845; H05K 2201/09827; H05K 2201/09836; H05K 1/185;
(Continued)

(56) References Cited

U.S. PATENT DOCUMENTS 7,761,982 B2 *  7/2010  Nagase ............... H01L 23/5389
                                                        257/758
8,692,135 B2 *  4/2014  Funaya ............. H01L 23/49827
                                                        174/258
(Continued)

FOREIGN PATENT DOCUMENTS

CN        101449634 A       6/2009
JP        2006-196840 A     7/2006
(Continued)

OTHER PUBLICATIONS

Search Report for PCT/JP2013/050984, mailed Feb. 19, 2013.
(Continued)

*Primary Examiner* — Binh Tran
(74) *Attorney, Agent, or Firm* — Marshall, Gerstein & Borun LLP (57) ABSTRACT

A device embedded substrate (20), includes: an insulation layer (12) including an insulation resin material; an electric or electronic device (4) embedded in the insulation layer (12); a terminal (15) serving as an electrode included in the device (4); a conductor pattern (18) formed on the surface of the insulation layer (12); and a conducting via (21) for electrically connecting the conductor pattern (18) and the terminals (15) with each other. The conducting via (21) is made up of a large-diameter section (21*a*) having a large diameter and a small-diameter section (21*b*) having a smaller diameter than that of the large-diameter section (21*a*), in order starting from the conductor pattern (18) toward the terminal (15). A stepped section (17) is formed between the large-diameter section (21*a*) and the small-
(Continued)

diameter section (21b). The large-diameter section (21a) is formed so as to penetrate a sheet-shaped glass cloth (11) disposed in the insulation layer (12).

9 Claims, 4 Drawing Sheets (51) Int. Cl.
*H05K 1/02* (2006.01)
*H05K 3/00* (2006.01)
*H01L 23/00* (2006.01)
*H01L 23/522* (2006.01)
*H05K 3/30* (2006.01)
*H05K 3/46* (2006.01)

(52) U.S. Cl.
CPC .......... *H05K 1/0298* (2013.01); *H05K 1/115* (2013.01); *H05K 1/188* (2013.01); *H05K 3/0017* (2013.01); *H05K 3/0035* (2013.01); *H05K 3/4652* (2013.01); *H01L 23/5226* (2013.01); *H01L 2224/04105* (2013.01); *H01L 2224/2518* (2013.01); *H01L 2224/32245* (2013.01); *H01L 2224/82005* (2013.01); *H01L 2224/82039* (2013.01); *H01L 2224/83005* (2013.01); *H01L 2224/92144* (2013.01); *H05K 1/0206* (2013.01); *H05K 1/0222* (2013.01); *H05K 1/113* (2013.01); *H05K 1/114* (2013.01); *H05K 1/185* (2013.01); *H05K 3/305* (2013.01); *H05K 3/4602* (2013.01); *H05K 2201/09827* (2013.01); *H05K 2201/10* (2013.01); *H05K 2203/063* (2013.01); *H05K 2203/1461* (2013.01); *Y10T 156/10* (2015.01)

(58) Field of Classification Search
CPC .... H05K 2201/10; H05K 1/113; H05K 1/114; H05K 1/115; H05K 23/5226; H05K 1/0206; H05K 1/0222; H05K 1/0251; H05K 1/112; H05K 2201/09509; H05K 2201/09518; H05K 2201/09527
USPC .......................... 361/748, 761–764; 174/262
See application file for complete search history.

(56) References Cited

U.S. PATENT DOCUMENTS

| | | |
|---|---|---|
| 2009/0107715 A1 | 4/2009 | Sasaoka |
| 2009/0133910 A1 | 5/2009 | Ohashi et al. |
| 2011/0048783 A1 | 3/2011 | Yu |
| 2011/0121445 A1 | 5/2011 | Mori et al. |

FOREIGN PATENT DOCUMENTS

| | | |
|---|---|---|
| JP | 2007-88009 | 4/2007 |
| JP | 2009-194382 A | 8/2009 |
| JP | 2009-246358 A | 10/2009 |
| JP | 2010-128934 A | 6/2010 |
| JP | 4874305 B2 | 2/2012 |
| JP | 2012-142559 A | 7/2012 |
| JP | 2012-209340 A | 10/2012 |
| TW | 201234945 A | 8/2012 |
| WO | WO-2010/010911 A1 | 1/2010 |
| WO | WO-2012/042667 A1 | 4/2012 |

OTHER PUBLICATIONS

Written Opinion for PCT/JP2013/050984, mailed Feb. 19, 2013.
Extended European Search Report for European Patent Application No. 13872019, dated Jul. 27, 2016.

* cited by examiner

DEVICE EMBEDDED SUBSTRATE AND MANUFACTURING METHOD OF DEVICE EMBEDDED SUBSTRATE

TECHNICAL FIELD

The present invention relates to a device embedded substrate and a manufacturing method of device embedded substrate.

BACKGROUND ART

A device embedded substrate is described in Patent Document 1. As described in Patent Document 1, the device embedded substrate is formed by mounting an electric or electronic device on a conduction layer which serves as a conductor pattern, and embedding it in an insulation layer such as a prepreg. When the device is embedded, the device is passed through a perforation of a perforated prepreg and a perforated core material, which are hollowed in a portion corresponding to the relevant device, and a cover prepreg on which no perforation is formed is laminated thereabove and pressed. After lamination, conduction between a terminal and the conduction pattern is achieved by forming a via which is a perforation reaching an electrode terminal included in the device, and plating the inner surface thereof, or by soldering without using a via.

Such a via is typically processed by $CO_2$ laser. In laser processing, power, a pulse width, the number of shots, and the like are specified depending on time and circumstances.

On the other hand, when conduction is desired for both faces (upper and lower faces) of the device, a via which reaches a device terminal is further formed on the opposite face. Then, the via is subjected to a plating process to achieve conduction between the device terminal and the conductor pattern.

PRIOR ART DOCUMENT

Patent Document

Patent Document 1: Japanese Patent No. 4874305

SUMMARY OF THE INVENTION

Problems to be Solved by the Invention

However, the cover prepreg is present above the device, and this cover prepreg is not provided with a perforation for passing the device in a viewpoint of lamination wrinkles and flatness as described above, or strength thereof. Therefore, when a via is formed, it is necessary to make it penetrate a glass cloth in the cover prepreg. Since space is provided between the cover prepreg and the front face of the device during lamination, the cover prepreg is likely to droop into this portion and accordingly the glass cloth comes close to the front face of the device. In the laser processing for penetrating the glass cloth, its control is difficult and there is a risk of damaging the droop itself if the distance between the glass cloth and the droop is small.

An object of the present invention, which has been made in consideration of the above described conventional techniques, is to provide a device embedded substrate, and a manufacturing method thereof, in which even in a case where a via penetrating the glass cloth is formed, the device is not likely to be damaged during the via forming process.

Means for Solving the Problems

In order to achieve the above object, an aspect of the present invention is directed to provide a device embedded substrate, comprising: an insulation layer including an insulation resin material; an electric or electronic device embedded in the insulation layer; a terminal serving as an electrode included in the device; a conductor pattern formed on a surface of the insulation layer; and a conducting via for electrically connecting the conductor pattern and the terminals with each other, wherein the conducting via is made up of a large-diameter section having a large diameter and a small-diameter section having a smaller diameter than that of the large-diameter section, in order starting from the conductor pattern toward the terminal, a stepped section is formed between the large-diameter section and the small-diameter section, and the large-diameter section is formed so as to penetrate a sheet-shaped glass cloth disposed in the insulation layer.

Further, the present invention provides a method for manufacturing a device embedded substrate, comprising: a mounting step of bonding a metal film on a support plate having rigidity, and mounting an electric or electronic device on the metal film; a lay-up step of passing the device through a through perforation of a perforated insulator, the through perforation through which the device is passed being formed in advance, and disposing a non-perforated insulator, in which a sheet-shaped glass cloth is embedded, at a position for covering the through perforation; a lamination step of forming an insulation layer by pressing while heating the perforated insulator and the non-perforated insulator against each other, and embedding the device in the insulation layer; a via forming step of forming a via which reaches a terminal included in the device from an outer side of the insulation layer; and a pattern forming step of forming a conductor pattern on a surface of the insulation layer, and filling the via with a conductor for electrically connecting the conductor pattern with the terminal to form a conducting via; wherein
in the lay-up step, the perforated insulator is formed from a fluid body having fluidity and a rigid body having rigidity, and a thickness of the fluid body is 30% to 90% of that of the perforated insulator, and wherein
in the via forming step, after a large-diameter via having a large diameter and penetrating the glass cloth is formed, a small-diameter via having a diameter smaller than that of the large-diameter via is formed such that the small-diameter via reaches the terminal while forming a stepped section with respect to the large-diameter via.

Preferably, in the above described via forming step, the glass cloth protruding into the via is removed by glass etching.

Preferably, in the above described lay-up step, the non-perforated insulator has a melting start temperature equal to or higher than that of the perforated insulator.

Preferably, the position of the glass cloth is controlled in a range of 40% to 90% of the thicknesses of the perforated insulator and the non-perforated insulator.

Preferably, after the pattern forming step, an outer lamination step of pressing and laminating an outer insulator made of an insulation resin material onto the conductor pattern from outside thereof to form a multilayer substrate is further performed, and in the outer lamination step, pressure applied to each one of the conducting via made up of the large-diameter via and the small-diameter via is adapted to be not more than 50 gf.

Preferably, after the pattern forming step, an outer lamination step of pressing and laminating an outer insulator made of an insulation resin material onto the conductor pattern from outside thereof to form a multilayer substrate is further performed, and the thicknesses of the large-diameter via and the small-diameter via are not more than 15% of the thickness of the multilayer substrate.

Preferably, after the pattern forming step, an outer lamination step of pressing and laminating an outer insulator made of an insulation resin material onto the conductor pattern from an outer side thereof to form a multilayer substrate is further performed, and the thickness of the terminal to which the small-diameter via reaches is not less than 12 μm.

Advantageous Effects of the Invention

According to the present invention, a large-diameter section and a small-diameter section are provided in a conducting via, and the large-diameter section penetrates a glass cloth. Such large-diameter section and small-diameter section are formed as a large-diameter via and a small-diameter via during via formation. Therefore, the perforating process for penetrating the glass cloth and the perforating process for making a perforation reach the terminal can be performed at optimal conditions, respectively. Providing a stepped section between the large-diameter via and the small-diameter via makes it possible to prevent the glass cloth from protruding into the via (particularly, the small-diameter via). And this makes it is possible to ensure sound adhesion of plating to the entire inner wall of the via when plating process is performed for converting it into a conducting via.

On the other hand, when the thickness of the fluid body is 30% to 90% of that of the perforated insulator, the fluid body first enters into the through perforation in the lamination step, and thus it is possible to prevent the non-perforated insulator from drooping into the through perforation. This makes it possible to prevent the glass cloth from coming close to the device in the lamination step, and to perform the processing to penetrate the glass cloth at a location apart from the device. Thus, it is possible to prevent the device from being damaged during the via forming processing.

Moreover, removing the glass cloth protruding into the via by glass etching makes it possible to ensure further adhesion of plating inside the via.

Further, using a non-perforated insulator having a melting start temperature equal to or higher than that of the perforated insulator makes it possible to cause the perforated insulator to first flow into the through perforation in the lamination step. This makes it possible to prevent the non-perforated insulator from drooping.

MODE FOR CARRYING OUT THE INVENTION

First, a method for manufacturing a device embedded substrate relating to the present invention will be described.

Figure 1:
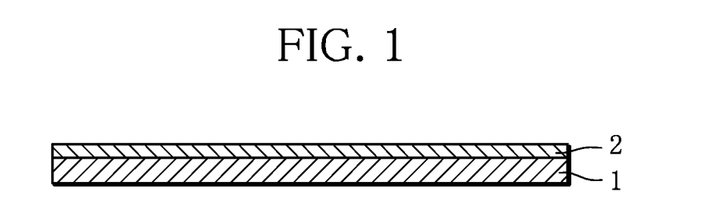
FIG. 1 is a schematic diagram to sequentially illustrate a method for manufacturing a device embedded substrate relating to the present invention.
Figure 2:
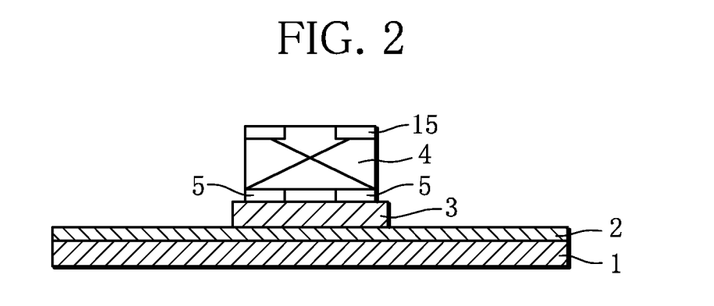
FIG. 2 is a schematic diagram to sequentially illustrate a method for manufacturing a device embedded substrate relating to the present invention.

As shown in FIGS. 1 and 2, a mounting step is performed. First, as shown in FIG. 1, a metal film 2 is bonded onto a support plate 1 having rigidity. The metal film 2 is supposed to become a conductor pattern at later time. A support plate 1, which has a level of rigidity required under processing conditions, is used. For example, it is formed from a SUS (stainless steel) plate or an aluminum plate, which has rigidity. The metal film 2 can be formed by depositing a copper plating when the support plate 1 is a SUS plate, and bonding a copper foil when the support plate 1 is an aluminum plate. Then, as shown in FIG. 2, an adhesive 3 consisting of an insulation material is applied onto the metal film 2, for example, with a dispenser, or by printing, etc. An electric or electronic device 4 is mounted on the adhesive 3. Note that mounting of the device 4 may be performed on the metal film 2 by using solder. In this example, terminals 5 and 15, which are each supposed to serve as an electrode, are formed on both faces of the device 4, respectively.

Figure 3:
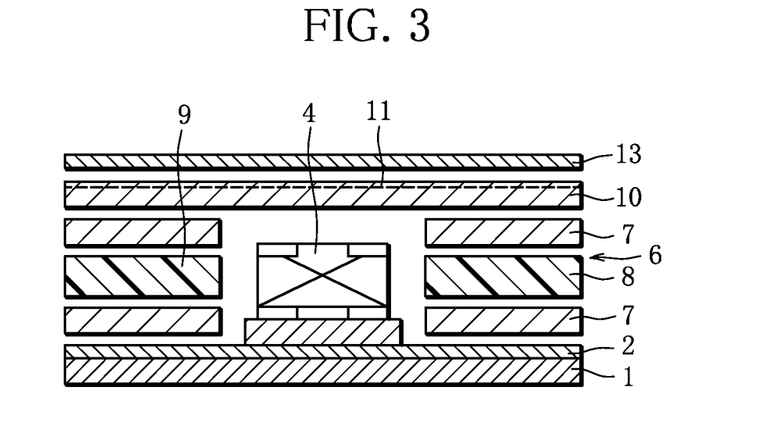
FIG. 3 is a schematic diagram to sequentially illustrate a method for manufacturing a device embedded substrate relating to the present invention.

Next, as shown in FIG. 3, a lay-up step is performed. First, a perforated insulator 6 is prepared. This perforated insulator 6 is formed from a fluid body 7 having fluidity and a rigid body 8 having rigidity, which are stacked together. The fluid body 7 is a prepreg. The rigid body 8, which is a so-called core material (unclad material), is formed from a metal plate which is contained as a core inside a multilayer printed wiring board, or a laminated plate on which a pattern is formed. The fluid body 7 and the rigid body 8 are provided with a through perforation 9 through which the device 4 is inserted. The through perforation 9 is formed by using a drill, a rooter, a die, and so on. FIG. 3 shows a perforated insulator 6 in which two layers of the fluid bodies 7 and one layer of the rigid body 8 interposed therebetween are stacked together. The device 4 is inserted into the through perforation 9 of the perforated insulator 6. Then, a non-perforated insulator 10 is further stacked thereon so as to cover the through perforation 9. This non-perforated insulator 10 is also a prepreg. Since it is a prepreg, a sheet-shaped glass cloth 11 is embedded in the non-perforated insulator 10. The glass cloth 11 is a cloth woven with threads of glass fiber. Note that a further metal film 13 is disposed on a surface of the non-perforated insulator 10 opposite to the device 4. This metal film 13 is also supposed to serve as a conductor pattern at later time. Note that the thickness of the fluid body 7 is specified to be 30% to 90% of that of the perforated insulator 6.

Figure 4:
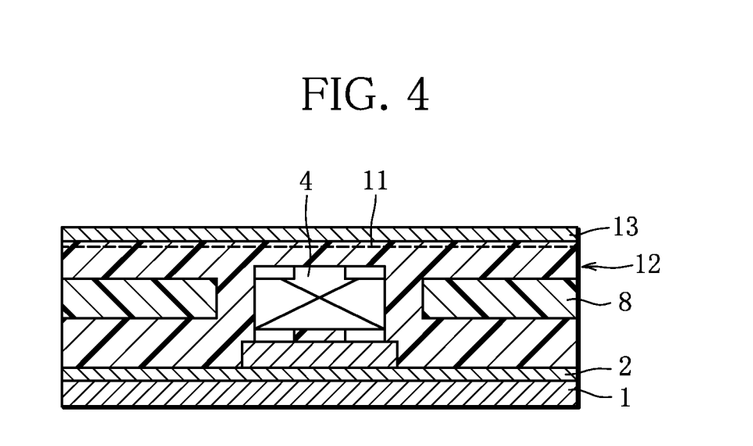
FIG. 4 is a schematic diagram to sequentially illustrate a method for manufacturing a device embedded substrate relating to the present invention.

Next, as shown in FIG. 4, a lamination step is performed. The lamination step is a step of forming an insulation layer 12 by pressing while heating the perforated insulator 6 and the non-perforated insulator 10 against each other, and embedding the device 4 in the insulation layer 12. The heating causes the non-perforated insulator 10 and the fluid body 7, which are each made from a prepreg, to integrally flow and enter inside the through perforation 9. At this moment, the presence of the rigid body 8 allows the device 4 to be properly embedded during pressing. Note that in the above described lay-up step, using a non-perforated insulator 10 which has a melting start temperature higher than that of the perforated insulator 6 (particularly, the fluid body 7) makes it possible to cause the fluid body 7 to securely flow ahead into the through perforation 9, thereby preventing drooping of the non-perforated insulator 10. The support plate 1 is thereafter removed. At this moment, the position of the glass cloth 11 is controlled in a range of 40% to 90% of the thicknesses of the perforated insulator 6 and the non-perforated insulator 10.

After completion of the lamination step, the glass cloth 11 disposed in the non-perforated insulator 10 remains to be kept in parallel with the metal film 2 and the rigid body 8. That is, the glass cloth 11 will not droop into the through perforation 9 even if it is melted by heating. This is because the thickness of the fluid body 7 is made to be 30% to 90% of the thickness of the perforated insulator 6 in the above described lay-up step. Note that the reason why the upper limit of the thickness of the fluid body 7 is specified to be 90% is because it is taken into consideration that the thickness of the rigid body 8 is not less than 10% of that of the non-perforated insulator 10. Specifying as describe above results in that the fluid body 7 first flows into the through perforation 9 in the lamination step. The fluid body 7 which has entered inside the through perforation 9 results in supporting the non-perforated insulator 10, thereby preventing the non-perforated insulator 10 including the glass cloth 11 from drooping. This makes it possible to prevent the glass cloth 11 from coming close to the device 4 in the lamination step. As a result of this, when forming a large-diameter via 14a which penetrates the glass cloth 11 in the next via forming step, it becomes possible to perform the perforating process at a location apart from the device 4. Therefore, it is possible to prevent the device from being damaged when via forming processing is performed. Preferably, the glass cloth 11 is located at a distance not less than 30 μm to 70 μm apart from the device 4. The inventors have experimentally confirmed that when the thickness of the fluid body 7 is less than 30% of that of the perforated insulator 6, it is likely that the non-perforated insulator 10, and therefore the glass cloth 11 droops.

Figure 5:
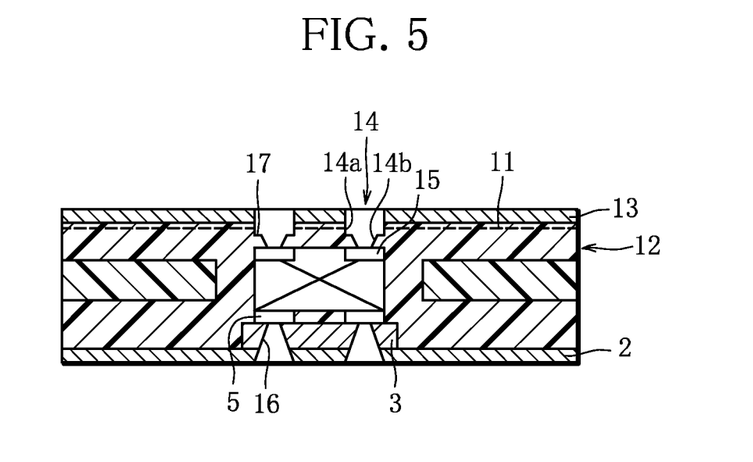
FIG. 5 is a schematic diagram to sequentially illustrate a method for manufacturing a device embedded substrate relating to the present invention.
Figure 7:
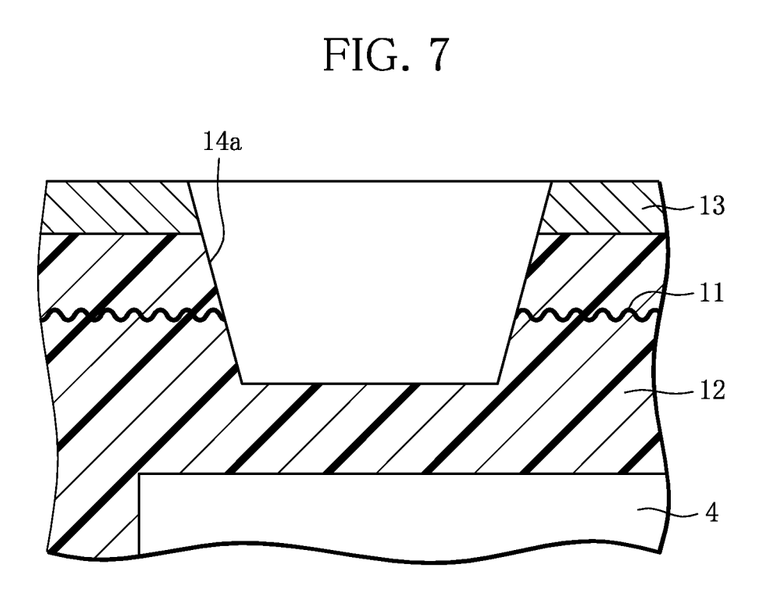
FIG. 7 is a detailed diagram to illustrate a via forming process.

Next, as shown in FIG. 5, a via forming step is performed. This step is a step of forming vias 14 and 16 which reach the terminals 5 and 15 included in the device 4, respectively, from the outside of the insulation layer 12. The via 16 which reaches the terminal 5 on the adhesive 3 side is formed by ordinary laser processing. The via 14 which reaches the terminal 15 on the opposite side of the adhesive 3 is formed as described below. First, as shown in FIG. 7, a large-diameter via 14a which penetrates the glass cloth 11 but does not reach the device 4 is formed. Since the large-diameter via 14a does not require much accuracy in the depth of processing, not only $CO_2$ laser, but also a high-frequency laser such as UV-YAG laser and Excimer laser may be used. For example, when UV-YAG laser is used, it is performed under conditions: the beam mode is a Gaussian type, the power is 2.6 W, and the number of shots is three. The depth of the large-diameter via 14a is, for example, 50 μm to 100 μm.

If the glass cloth 11 protrudes into the large-diameter via 14a after the formation of the large-diameter via 14a, it is preferable to remove the protruding part by glass etching. This ensures adhesion of plating to the inside of the via 14 when plating to the inside of the via 14 is performed in a following step.

Figure 8:
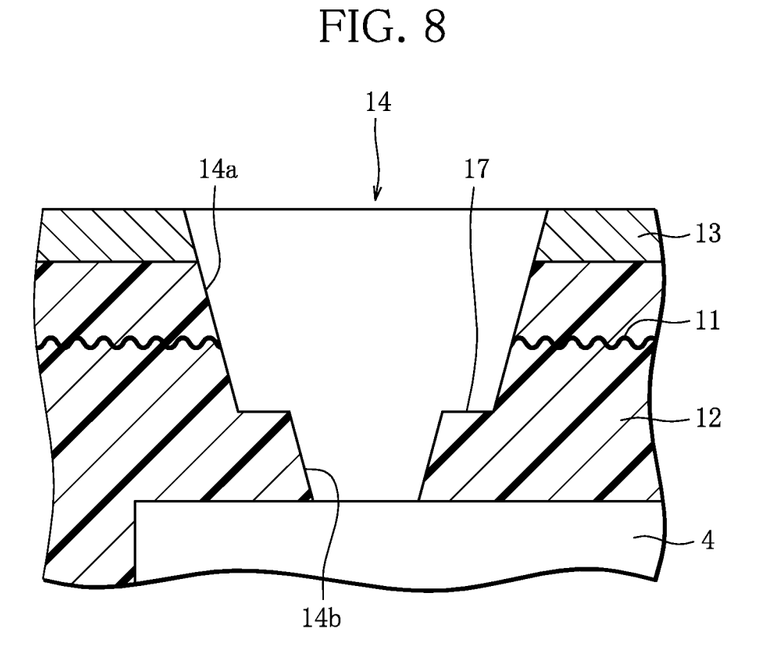
FIG. 8 is a detailed diagram to illustrate a via forming process.

Next, as shown in FIG. 8, a small-diameter via 14b having a diameter smaller than that of the large-diameter via 14a is formed. When forming the small-diameter via 14b, it is preferable to use a high-precision high-frequency laser so as not to damage the device 4. For example, when UV-YAG laser is used, it is performed under conditions: the beam mode is a top-hat type, the power is 0.1 W to 0.4 W, and the number of shots is five to 10. Further, the inner walls of the large-diameter via 14a and the small-diameter via 14b are provided with a stepped section 17 provided therebetween. Thus providing the stepped section 17 between the large-diameter via 14a and the small-diameter via 14b makes it possible to prevent the glass cloth 11 from protruding into the via 14 (particularly, into the small-diameter via 14b) even if for example the glass cloth 11 is located on the surface of the stepped section 17 when the large-diameter via 14a is formed. This ensures adhesion of plating to the entire inner wall of the via 14 when plating to the inside of the via 14 is performed in a following step. The perforation diameter of the large-diameter via 14a is for example 80 μm to 150 μm, and that of the small-diameter via 14b is in a smaller range of 50 μm to 100 μm.

Thus, in the present invention, when conduction to the surface opposite to the mounted surface of the device 4 is intended, the via 14 for that purpose is formed from the large-diameter via 14a and the small-diameter via 14b with the stepped section 17 provided therebetween. Thus, the perforating process for penetrating glass cloth (perforating process of the large-diameter via 14a) and the perforating process for reaching the terminal 15 (perforating process of the small-diameter via 14b) can be performed at optimal conditions, respectively.

Figure 6:
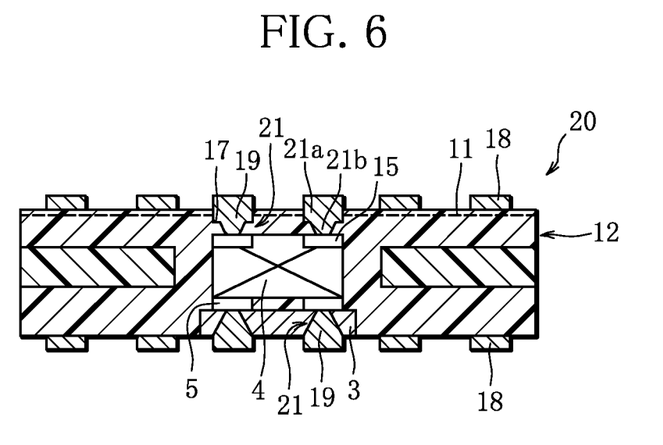
FIG. 6 is a schematic diagram to sequentially illustrate a method for manufacturing a device embedded substrate relating to the present invention.

Next, as shown in FIG. 6, a pattern forming step is performed. This step is a step of filling the vias 14 and 16 with the conductor 19, and forming a conductor pattern 18 on the surface of the insulation layer 12 to electrically connect the terminals 5 and 15 with the conductor pattern 18 via the conductor 19. Specifically, desmear and half-etching processing are performed on the vias 14 and 16 as needed, and thereafter a plating process such as chemical copper plating and electric copper plating is performed to cause plating to be deposited in the vias 14 and 16, thereby filling them with the conductor 19. Then, a conductor pattern 18 is formed by performing etching processing on the metal films 2 and 13 disposed on both faces of the insulation layer 12.

The device embedded substrate 20 manufactured as described above includes an insulation layer 12, a device 4, a conductor pattern 18, and a conducting via 21. The insulation layer 12 includes a prepreg (a fluid body in the perforated insulator 6 and a non-perforated insulator 10) as an insulation resin material. The device 4, which is an electric or electronic device, is embedded in the insulation layer 12. Note that the device 4 may either be a passive component or an active component. The device 4 is provided with terminals 5 and 15 which are each to serve as an electrode. The conductor pattern 18 is formed as a circuit pattern on the surface of the insulation layer 12. The conducting via 21 electrically connects the conductor pattern 18 with the terminals 5 and 15. In particular, the conducting via 21, which is connected to the terminal 15 on the opposite side to the mounting face of the device 4, is formed from a large-diameter section 21a and a small-diameter section 21b having a smaller diameter than that of the large-diameter section 21a, starting from the conductor pattern 18 toward the terminal 15. The large-diameter section 21a is formed so as to penetrate the sheet-shaped glass cloth 11 disposed in the insulation layer 12. Moreover, a stepped section 17 is formed between the large-diameter section 21a and the small-diameter section 21b.

Figure 9:
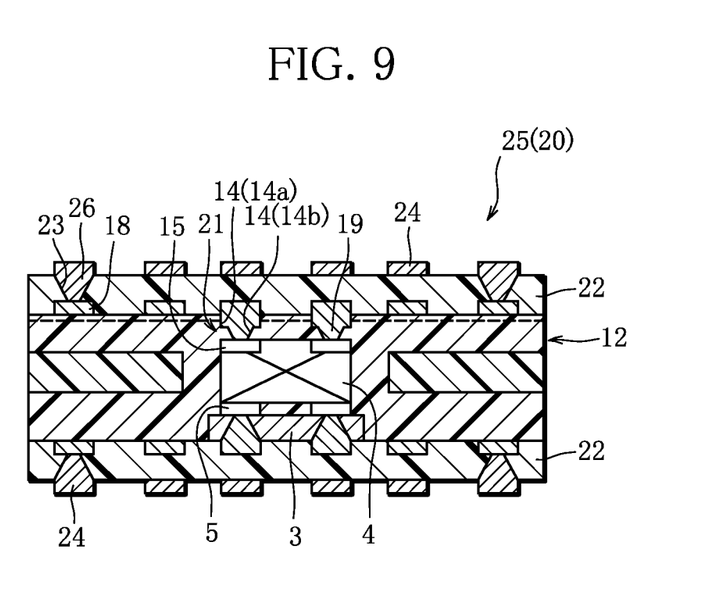
FIG. 9 is a schematic diagram to show an example of a multilayer substrate.

As shown in FIG. 9, an outer lamination step of further laminating the outer insulator 22 from the outer side can be performed after the pattern forming step to obtain a so-called multilayer substrate 25. In such a case as well, after the outer insulator 22 is laminated, a via 23 is formed so as to achieve conduction with the conductor pattern 24 formed on the surface of the outer insulator 22. Conduction can be realized by applying plating process on the via 23 formed between the conductor pattern 18 and the conductor pattern 24, and forming a conducting via 26. This method for achieving conduction is the same as in the above described example. A prepreg is used for the outer insulator 22 as with the above described non-perforated insulator 10.

Here, the pressure applied to each one of the conducting via 21, which is made up of the large-diameter via 14a and the small-diameter via 14b, is preferably not more than 50 gf in the outer lamination step. Moreover, the thicknesses of the large-diameter via 14a and the small-diameter via 14b are preferably not more than 15% of the thickness of the multilayer substrate 25. Further, the thickness of the terminal 15 to which the small-diameter via 14b reaches is preferably not less than 12 μm (the thickness of the multilayer substrate is 400 μm).

Specifying as described above makes it possible to prevent generation of cracking in the terminal 15 in the outer lamination step when forming the multilayer substrate 25. The inventors have confirmed that such cracking can be prevented by reducing the pressure applied to the conducting via 21 made up of the large-diameter via 14a and the small-diameter via 14b. For that purpose, it is conceivable to mitigate stress such as by reducing the pressure during lamination, increasing via density, increasing the via diameters, and utilizing a via which is not filled with the conductor 19. Moreover, it is also conceivable to disperse stress by reducing the thickness of the via 14. Furthermore, it is conceivable to disperse stress by increasing the thickness of the electrode of the terminal 15.

EXPLANATION OF REFERENCE SIGNS

1 Support plate
2 Metal film
3 Adhesive
4 Electric or electronic device
5 Terminal
6 Perforated insulator
7 Fluid body
8 Rigid body
9 Through perforation
10 Non-perforated insulator
11 Glass cloth
12 Insulation layer
13 Metal film
14 Via
14a Large-diameter via
14b Small-diameter via
15 Terminal
16 Via
17 Stepped section
18 Conductor pattern
19 Conductor
20 Device embedded substrate
21 Conducting via
21a Large-diameter section
21b Small-diameter section
22 Outer insulator
23 Via
24 Conductor pattern
25 Multilayer substrate
26 Conducting via

The invention claimed is:

1. A device embedded substrate, comprising:
an insulation layer including an insulation resin material, the insulation layer comprising a perforated layer and a non-perforated layer;
the perforated layer formed from a fluid body, the fluid body having a thickness measuring from 30% to 90% of a thickness of the perforated layer;
an electric or electronic device embedded in the insulation layer;
a terminal serving as an electrode included in the device;
a conductor pattern formed on a surface of the insulation layer; and
a conducting via for electrically connecting the conductor pattern and the terminals with each other, wherein
the conducting via is made up of a large-diameter section having a large diameter and a small-diameter section having a smaller diameter than that of the large-diameter section, in order starting from the conductor pattern toward the terminal,
wherein the small diameter section reaches the terminal and forms a stepped section between the large-diameter section and the small-diameter section, and
the large-diameter section is formed so as to penetrate a sheet-shaped glass cloth disposed in the insulation layer.

2. The device embedded substrate according to claim 1, wherein the perforated layer further comprises a rigid body.

3. A method for manufacturing a device embedded substrate, comprising:
a mounting step of bonding a metal film on a support plate having rigidity, and mounting an electric or electronic device on the metal film;
a lay-up step of passing the device through a through perforation of a perforated insulator, the through perforation through which the device is passed being formed in advance, and disposing a non-perforated insulator, in which a sheet-shaped glass cloth is embedded, at a position for covering the through perforation;
a lamination step of forming an insulation layer by pressing while heating the perforated insulator and the non-perforated insulator against each other, and embedding the device in the insulation layer;
a via forming step of forming a via which reaches a terminal included in the device from an outer side of the insulation layer; and
a pattern forming step of forming a conductor pattern on a surface of the insulation layer, and filling the via with a conductor for electrically connecting the conductor pattern with the terminal to form a conducting via; wherein
in the lay-up step, the perforated insulator is formed from a fluid body having fluidity and a rigid body having rigidity, and a thickness of the fluid body is 30% to 90% of that of the perforated insulator, and wherein
in the via forming step, after a large-diameter via having a large diameter and penetrating the glass cloth is formed, a small-diameter via having a diameter smaller than that of the large-diameter via is formed such that the small-diameter via reaches the terminal while forming a stepped section with respect to the large-diameter via.

4. The method for manufacturing a device embedded substrate according to claim 3, wherein
in the via forming step, the glass cloth protruding into the via is removed by glass etching.

5. The method for manufacturing a device embedded substrate according to claim 3, wherein
in the lay-up step, the non-perforated insulator has a melting start temperature equal to or higher than that of the perforated insulator.

6. The method for manufacturing a device embedded substrate according to claim 3, wherein
a position of the glass cloth is controlled in a range of 40% to 90% of the thicknesses of the perforated insulator and the non-perforated insulator.

7. The method for manufacturing a device embedded substrate according to claim 3, wherein
after the pattern forming step, an outer lamination step of pressing and laminating an outer insulator made of an insulation resin material onto the conductor pattern from an outer side thereof to form a multilayer substrate is further performed, and
in the outer lamination step, pressure applied to each one of the conducting via made up of the large-diameter via and the small-diameter via is adapted to be not more than 50 gf.

8. The method for manufacturing a device embedded substrate according to claim 3, wherein
after the pattern forming step, an outer lamination step of pressing and laminating an outer insulator made of an insulation resin material onto the conductor pattern from an outer side thereof to form a multilayer substrate is further performed, and
thicknesses of the large-diameter via and the small-diameter via are not more than 15% of the thickness of the multilayer substrate.

9. The method for manufacturing a device embedded substrate according to claim 3, wherein
after the pattern forming step, an outer lamination step of pressing and laminating an outer insulator made of an insulation resin material onto the conductor pattern from an outer side thereof to form a multilayer substrate is further performed, and
a thickness of the terminal to which the small-diameter via reaches is not less than 12 μm.

* * * * *